(12) United States Patent
Dreps et al.

(10) Patent No.: US 7,224,595 B2
(45) Date of Patent: May 29, 2007

(54) 276-PIN BUFFERED MEMORY MODULE WITH ENHANCED FAULT TOLERANCE

(75) Inventors: Daniel M. Dreps, Georgetown, TX (US); Frank D. Ferriaolo, New Windsor, NY (US); Kevin C. Gower, LaGrangeville, NY (US); Mark W. Kellogg, Henrietta, NY (US); Roger A. Rippens, Salt Point, NY (US)

(73) Assignee: International Business Machines Corporation, Armonk, NY (US)

( * ) Notice: Subject to any disclaimer, the term of this patent is extended or adjusted under 35 U.S.C. 154(b) by 57 days.

(21) Appl. No.: 10/903,371

(22) Filed: Jul. 30, 2004

(65) Prior Publication Data

US 2006/0023482 A1    Feb. 2, 2006

(51) Int. Cl.
*G11C 5/06* (2006.01)
*G11C 5/02* (2006.01)

(52) U.S. Cl. .................. 365/63; 365/51; 365/52; 361/728

(58) Field of Classification Search .................. 365/63
See application file for complete search history.

(56) References Cited

U.S. PATENT DOCUMENTS

| | | | |
|---|---|---|---|
| 3,825,904 A | 7/1974 | Burk et al. | |
| 4,475,194 A | 10/1984 | LaVallee et al. | 371/10 |
| 4,486,739 A | 12/1984 | Franaszek et al. | 340/347 DD |
| 4,723,120 A | 2/1988 | Petty, Jr. | 340/825.02 |
| 4,740,916 A | 4/1988 | Martin | 364/900 |
| 4,833,605 A | 5/1989 | Terada et al. | 364/200 |
| 4,839,534 A | 6/1989 | Clasen | 307/269 |
| 4,943,984 A | 7/1990 | Pechanek et al. | 375/109 |
| 4,985,828 A | 1/1991 | Shimizu et al. | |
| 5,053,947 A | 10/1991 | Heibel et al. | 364/200 |
| 5,214,747 A | 5/1993 | Cok | 395/27 |
| 5,287,531 A | 2/1994 | Rogers, Jr. et al. | 395/800 |
| 5,387,911 A | 2/1995 | Gleichert et al. | 341/95 |
| 5,454,091 A | 9/1995 | Sites et al. | |
| 5,475,690 A | 12/1995 | Burns et al. | 370/105.3 |
| 5,513,135 A * | 4/1996 | Dell et al. | 365/52 |
| 5,592,632 A | 1/1997 | Leung et al. | 395/306 |
| 5,611,055 A | 3/1997 | Krishan et al. | 395/281 |
| 5,613,077 A | 3/1997 | Leung et al. | 395/306 |
| 5,629,685 A | 5/1997 | Allen et al. | 340/825.02 |
| 5,661,677 A | 8/1997 | Rondeau, II et al. | |
| 5,666,480 A | 9/1997 | Leung et al. | 395/180 |
| 5,822,749 A | 10/1998 | Agarwal | |

(Continued)

OTHER PUBLICATIONS

Sivencrona et al.; "RedCAN™: Simulations of two Fault Recovery Algorithms for CAN;" Proceedings for the 10th IEEE Pacific Rim International Symposium on Dependable Computing (PRDC'04); 2005.

(Continued)

*Primary Examiner*—Son L. Mai
(74) *Attorney, Agent, or Firm*—Cantor Colburn LLP

(57) ABSTRACT

A dual inline memory module (DIMM) includes a card having a length of about 151.2 to about 151.5 millimeters, a plurality of individual local memory devices attached to the card, and a buffer device attached to the card, the buffer device configured for converting a packetized memory interface. The card includes at least 276 pins configured thereon.

11 Claims, 15 Drawing Sheets

U.S. PATENT DOCUMENTS

| | | | |
|---|---|---|---|
| 5,870,325 A * | 2/1999 | Nielsen et al. | 365/63 |
| 5,872,996 A | 2/1999 | Barth et al. | 395/853 |
| 5,926,838 A | 7/1999 | Jeddeloh | 711/167 |
| 5,928,343 A | 7/1999 | Farmwald et al. | 710/104 |
| 5,973,951 A * | 10/1999 | Bechtolsheim et al. | 365/52 |
| 5,995,405 A | 11/1999 | Trick | 365/63 |
| 6,038,132 A * | 3/2000 | Tokunaga et al. | 361/760 |
| 6,049,476 A | 4/2000 | Laudon et al. | 365/52 |
| 6,076,158 A | 6/2000 | Sites et al. | |
| 6,078,515 A * | 6/2000 | Nielsen et al. | 365/63 |
| 6,096,091 A | 8/2000 | Hartmann | 716/17 |
| 6,128,746 A | 10/2000 | Clark et al. | 713/324 |
| 6,170,047 B1 | 1/2001 | Dye | |
| 6,170,059 B1 | 1/2001 | Pruett et al. | |
| 6,215,686 B1 * | 4/2001 | Deneroff et al. | 365/52 |
| 6,292,903 B1 | 9/2001 | Coteus et al. | 713/401 |
| 6,317,352 B1 | 11/2001 | Halbert et al. | 365/52 |
| 6,321,343 B1 | 11/2001 | Toda | 713/600 |
| 6,338,113 B1 | 1/2002 | Kubo et al. | 711/105 |
| 6,370,631 B1 | 4/2002 | Dye | |
| 6,378,018 B1 | 4/2002 | Tsern et al. | 710/129 |
| 6,393,528 B1 | 5/2002 | Arimilli et al. | |
| 6,473,836 B1 | 10/2002 | Ikeda | |
| 6,483,755 B2 | 11/2002 | Leung et al. | 365/189.05 |
| 6,493,250 B2 | 12/2002 | Halbert et al. | 365/63 |
| 6,496,540 B1 | 12/2002 | Windmer | 375/242 |
| 6,496,910 B1 | 12/2002 | Baentsch et al. | |
| 6,502,161 B1 | 12/2002 | Perego et al. | 711/5 |
| 6,507,888 B2 | 1/2003 | Wu et al. | 711/105 |
| 6,510,100 B2 | 1/2003 | Grundon et al. | 365/233 |
| 6,513,091 B1 | 1/2003 | Blackmon et al. | 710/316 |
| 6,526,469 B1 | 2/2003 | Drehmel et al. | 710/306 |
| 6,532,525 B1 | 3/2003 | Aleksic et al. | 711/168 |
| 6,549,971 B1 | 4/2003 | Cecchi et al. | 710/306 |
| 6,553,450 B1 | 4/2003 | Dodd et al. | 711/105 |
| 6,557,069 B1 | 4/2003 | Drehmel et al. | 710/307 |
| 6,564,329 B1 | 5/2003 | Cheung et al. | |
| 6,601,121 B2 | 7/2003 | Singh et al. | 710/112 |
| 6,611,905 B1 | 8/2003 | Grundon et al. | 711/167 |
| 6,622,217 B2 | 9/2003 | Gharachorloo et al. | 711/141 |
| 6,625,687 B1 | 9/2003 | Halbert et al. | 711/105 |
| 6,625,702 B2 | 9/2003 | Rentschler et al. | |
| 6,631,439 B2 | 10/2003 | Saulsbury et al. | |
| 6,678,811 B2 | 1/2004 | Rentschler et al. | 711/167 |
| 6,697,919 B2 | 2/2004 | Gharachorloo et al. | 711/141 |
| 6,704,842 B1 | 3/2004 | Janakiraman et al. | |
| 6,721,944 B2 | 4/2004 | Chaudhry et al. | |
| 6,738,836 B1 | 5/2004 | Kessler et al. | |
| 6,766,389 B2 | 7/2004 | Hayter et al. | |
| 6,775,747 B2 | 8/2004 | Venkatraman | |
| 6,791,555 B1 | 9/2004 | Radke et al. | |
| 6,839,393 B1 | 1/2005 | Sidiropoulos | 375/371 |
| 6,877,076 B1 | 4/2005 | Cho et al. | |
| 6,877,078 B2 | 4/2005 | Fujiwara et al. | |
| 6,889,284 B1 | 5/2005 | Nizar et al. | |
| 6,977,536 B2 | 12/2005 | Chin-Chich et al. | 327/116 |
| 2001/0000822 A1 | 5/2001 | Dell et al. | 711/170 |
| 2001/0003839 A1 | 6/2001 | Kondo | |
| 2002/0019926 A1 | 2/2002 | Hupperthal et al. | 712/15 |
| 2002/0038405 A1 | 3/2002 | Leddige et al. | |
| 2002/0083255 A1 | 6/2002 | Greeff et al. | 710/305 |
| 2002/0103988 A1 | 8/2002 | Domier | |
| 2002/0112119 A1 | 8/2002 | Halbert et al. | |
| 2002/0112194 A1 | 8/2002 | Uzelac | 713/500 |
| 2002/0124195 A1 | 9/2002 | Nizar | |
| 2002/0147898 A1 | 10/2002 | Rentschler et al. | |
| 2002/0174274 A1 | 11/2002 | Wu et al. | |
| 2003/0033364 A1 | 2/2003 | Garnett et al. | 709/203 |
| 2003/0090879 A1 * | 5/2003 | Doblar et al. | 361/728 |
| 2003/0223303 A1 | 12/2003 | Lamb et al. | 365/230.06 |
| 2003/0236959 A1 | 12/2003 | Johnson et al. | 711/167 |
| 2004/0006674 A1 | 1/2004 | Hargis et al. | 711/156 |
| 2004/0117588 A1 | 6/2004 | Arimilli et al. | |
| 2004/0205433 A1 * | 10/2004 | Gower et al. | 714/733 |
| 2004/0230718 A1 | 11/2004 | Polzin et al. | |
| 2004/0246767 A1 | 12/2004 | Vogt | 365/154 |
| 2004/0260909 A1 | 12/2004 | Lee et al. | |
| 2004/0260957 A1 | 12/2004 | Jeddeloh et al. | |
| 2005/0050237 A1 | 3/2005 | Jeddeloh | |
| 2005/0050255 A1 | 3/2005 | Jeddeloh | |
| 2005/0066136 A1 | 3/2005 | Schnepper | |
| 2005/0080581 A1 | 4/2005 | Zimmerman et al. | |
| 2005/0120157 A1 | 6/2005 | Chen et al. | 710/313 |
| 2005/0125702 A1 | 6/2005 | Huang et al. | |
| 2005/0125703 A1 | 6/2005 | Lefurgy et al. | |
| 2005/0144399 A1 | 6/2005 | Hosomi | |
| 2005/0177690 A1 | 8/2005 | LaBerge | |
| 2005/0229132 A1 | 10/2005 | Butt et al. | 716/10 |
| 2005/0259496 A1 | 11/2005 | Hsu et al. | |

OTHER PUBLICATIONS

Jungjoon Kim et al.; "Performance and Architecture Features of Segmented Multiple Bus System;" IEEE Computer Society; 1999 International Conference on Parallel Processing (ICPP '99).

Ghoneima et al.; "Optimum Positioning of Interleaved Repeaters in Bidirectional Buses;" IEEE Transactions on Computer-Aided Design of Integrated Circuits and Systems, vol. 25, No. 3, Mar. 2005, pp. 461-469.

Seceleanu et al.; "Segment Arbiter as Action System;" IEEE 2003 pp. 249-252.

Understanding System Memory and CPU Speeds: A Layman's Guide to the Front Side Bus (FSB), [online]; [retrieved on Feb. 23, 2006]; retrieved from the Internet http://www.directron.com/fsbguide.html.

JEDEC Solid State Technology Association, "JEDEC Standard: DDR2 SDRAM Specification", Jan. 2004, JEDEC, Revision JESD79-2A, p. 10.

Brown, et al "Complier-Based I/O Prefetching for Out-of-Core Applications", ACM Transactions on Computer Systems, vol. 19, No. 2, May 2001, pp. 111-170.

Wang, et al "Guided Region Prefetching: A Cooperative Hardware/Software Approach", pp. 388-398.

Natarajan, et al "A Study of Performance Impact of Memory Controller Features in Multi-Processor Server Environment", pp. 80-87.

Nilsen, "High-Level Dynamic Memory Management for Object-Oriented Real-Time Systems", pp. 86-93.

Wang, et al "Guided Region Prefetching: A Cooperative Hardware/Software Approach", pp. 388-398, Jun. 03.

Natarajan, et al "A Study of Performance Impact of Memory Controller Features in Multi-Processor Server Environment", pp. 80-87, 2004.

Nilsen, "High-Level Dynamic Memory Management for Object-Oriented Real-Time Systems", pp. 86-93, 1996.

* cited by examiner

TYPICAL LARGE-SYSTEM MEMORY CONFIGURATION

| Buffer Mode | # Memory Ranks per DIMM | # of Buffer CS Outputs Used / Loads per CS | # Buffer Clock Pairs Used / Loads per Clock Pair | Misc |
|---|---|---|---|---|
| Buffer DIMM | 1 | 2 / 4-5 Loads | 2 / 4-5 Loads | 'Fly-by' topology |
|  | 2 | 4 / 4-5 Loads | 4 / 4-5 Loads | 'Fly-by' topology |
|  | 4 | 8 / 4-5 Loads | 6 / 6 Loads | 'Fly-by' topology |
|  | 8 | 8 / 9 Loads | 6 / 12 Loads | 'Fly-by' / "T" topology |
| Registered DIMM | 1 | 2 / 1 or 2 Loads | 2 / 1 or 2 Loads | Inputs wire to register or PLL (Clock) Direct connect or point to point |
|  | 2 | 4 / 1 or 2 Loads | 4 / 1 or 2 Loads | Inputs wire to register or PLL (Clock) Direct connect or point to point |
| Unbuffered DIMM | 1 | 2 / 4-9 Loads | 6 / 1-3 Loads | 'T' net topology |
|  | 2 | 2 / 8-18 Loads | 6 / 2-6 Loads | 'T' net topology |

FIG. 12

276 P: Buffered DIMM Pin Assignments

| TOP Pin Number | BOTTOM Pin Number | TOP Pin Function | BOTTOM Pin Function | Distance From Center Notch (or Key) left or right of notch |
|---|---|---|---|---|
| 1 | 139 | Continuity(0) | GND | 81.5 Distance To left of notch (front view) |
| 2 | 140 | VTT | VTT | 80.5 |
| 3 | 141 | scope_trigger(0) | scope_trigger(1) | 79.5 |
| 4 | 142 | serv_ifc(1) | serv_ifc(1)_r | 78.5 |
| 5 | 143 | serv_ifc(2) | serv_ifc(2)_r | 77.5 |
| 6 | 144 | rtu0 | rtu0_r | 76.5 |
| 7 | 145 | rtu1 | rtu1_r | 75.5 |
| 8 | 146 | GND | GND | 74.5 |
| 9 | 147 | 1.8V | 1.8V | 73.5 |
| 10 | 148 | us_s3(0) | s3_ds(0) | 72.5 |
| 11 | 149 | us_s3(1) | s3_ds(1) | 71.5 |
| 12 | 150 | GND | GND | 70.5 |
| 13 | 151 | 1.8V | 1.8V | 69.5 |
| 14 | 152 | us_s3(2) | s3_ds(2) | 68.5 |
| 15 | 153 | us_s3(3) | s3_ds(3) | 67.5 |
| 16 | 154 | GND | GND | 66.5 |
| 17 | 155 | 1.8V | 1.8V | 65.5 |
| 18 | 156 | us_s3(4) | s3_ds(4) | 64.5 |
| 19 | 157 | us_s3(5) | s3_ds(5) | 63.5 |
| 20 | 158 | GND | GND | 62.5 |
| 21 | 159 | 1.8V | 1.8V | 61.5 |
| 22 | 160 | us_s3(6) | s3_ds(6) | 60.5 |
| 23 | 161 | us_s3(7) | s3_ds(7) | 59.5 |
| 24 | 162 | GND | GND | 58.5 |
| 25 | 163 | 1.8V | 1.8V | 57.5 |
| 26 | 164 | us_s3(8) | s3_ds(8) | 56.5 |
| 27 | 165 | us_s3(9) | s3_ds(9) | 55.5 |
| 28 | 166 | GND | GND | 54.5 |
| 29 | 167 | 1.8V | 1.8V | 53.5 |
| 30 | 168 | us_s3(10) | s3_ds(10) | 52.5 |
| 31 | 169 | us_s3(11) | s3_ds(11) | 51.5 |
| 32 | 170 | GND | GND | 50.5 |
| 33 | 171 | 1.8V | 1.8V | 49.5 |
| 34 | 172 | s3_us(0) | ds_s3(0) | 48.5 |
| 35 | 173 | s3_us(1) | ds_s3(1) | 47.5 |
| 36 | 174 | GND | GND | 46.5 |
| 37 | 175 | 1.8V | 1.8V | 45.5 |
| 38 | 176 | s3_us(2) | ds_s3(2) | 44.5 |
| 39 | 177 | s3_us(3) | ds_s3(3) | 43.5 |
| 40 | 178 | GND | GND | 42.5 |
| 41 | 179 | 1.8V | 1.8V | 41.5 |
| 42 | 180 | s3_us(4) | ds_s3(4) | 40.5 |
| 43 | 181 | s3_us(5) | ds_s3(5) | 39.5 |
| 44 | 182 | GND | GND | 38.5 |
| 45 | 183 | 1.8V | 1.8V | 37.5 |
| 46 | 184 | s3_us_clk_n | s3_us_clk_n_r | 36.5 |
| 47 | 185 | s3_us_clk_p | s3_us_clk_p_r | 35.5 |
| 48 | 186 | us_s3_clk_n | us_s3_clk_n_r | 34.5 |
| 49 | 187 | us_s3_clk_p | us_s3_clk_p_r | 33.5 |
| 50 | 188 | 1.8V | 1.8V | 32.5 |
| 51 | 189 | GND | GND | 31.5 |
| 52 | 190 | s3_us(6) | ds_s3(6) | 30.5 |
| 53 | 191 | s3_us(7) | ds_s3(7) | 29.5 |
| 54 | 192 | 1.2V | 1.2V | 28.5 |
| 55 | 193 | GND | GND | 27.5 |
| 56 | 194 | s3_us(8) | ds_s3(8) | 26.5 |
| 57 | 195 | s3_us(9) | ds_s3(9) | 25.5 |
| 58 | 196 | 1.2V | 1.2V | 24.5 |
| 59 | 197 | GND | GND | 23.5 |
| 60 | 198 | serv_ifc(3) | serv_ifc(4) | 22.5 |
| 61 | 199 | serv_ifc(5) | serv_ifc(5)_r | 21.5 |
| 62 | 200 | serv_ifc(6) | serv_ifc(7) | 20.5 |
| 63 | 201 | serv_ifc(8) | serv_ifc(8)_r | 19.5 |
| 64 | 202 | 1.2V | 1.2V | 18.5 |
| 65 | 203 | SA0 | SA0_r | 17.5 |
| 66 | 204 | SA1 | SA1_r | 16.5 |
| 67 | 205 | SA2 | SA2_r | 15.5 |

| 15a |
|---|
| 15b |

| | | | | |
|---|---|---|---|---|
| 68 | 206 | vddstby(0) | vddstby(1) | 14.5 |
| 69 | 207 | PLL_VDDA | PLL_VDDA | 13.5 |
| 70 | 208 | VDDSPD | VDDSPD | 12.5 |
| 71 | 209 | serv_ifc(9) | serv_ifc(10) | 11.5 |
| 72 | 210 | serv_ifc(11) | serv_ifc(11)_r | 10.5 |
| 73 | 211 | serv_ifc(12) | serv_ifc(12)_r | 9.5 |
| 74 | 212 | serv_ifc(13) | serv_ifc(14) | 8.5 |
| 75 | 213 | 1.2V | 1.2V | 7.5 |
| 76 | 214 | GND | GND | 6.5 |
| 77 | 215 | power_rst | power_rst_r | 5.5 |
| 78 | 216 | s3_us(10) | ds_s3(10) | 4.5 |
| 79 | 217 | 1.2V | 1.2V | 3.5 |
| 80 | 218 | GND | GND | 2.5 Distance To left of notch (front view) |
| Notch | Notch | | | |
| 81 | 219 | s3_us(11) | ds_s3(11) | 2.5 Distance To right of notch (front view) |
| 82 | 220 | s3_us(12) | ds_s3(12) | 3.5 |
| 83 | 221 | 1.2V | 1.2V | 4.5 |
| 84 | 222 | GND | GND | 5.5 |
| 85 | 223 | s3_us(13) | ds_s3(13) | 6.5 |
| 86 | 224 | s3_us(14) | ds_s3(14) | 7.5 |
| 87 | 225 | 1.8V | 1.8V | 8.5 |
| 88 | 226 | GND | GND | 9.5 |
| 89 | 227 | s3_us(15) | ds_s3(15) | 10.5 |
| 90 | 228 | s3_us(16) | ds_s3(16) | 11.5 |
| 91 | 229 | GND | GND | 12.5 |
| 92 | 230 | 1.8V | 1.8V | 13.5 |
| 93 | 231 | s3_us(17) | ds_s3(17) | 14.5 |
| 94 | 232 | s3_us(18) | ds_s3(18) | 15.5 |
| 95 | 233 | GND | GND | 16.5 |
| 96 | 234 | 1.8V | 1.8V | 17.5 |
| 97 | 235 | s3_us(19) | ds_s3(19) | 18.5 |
| 98 | 236 | s3_us(20) | ds_s3(20) | 19.5 |
| 99 | 237 | GND | GND | 20.5 |
| 100 | 238 | 1.8V | 1.8V | 21.5 |
| 101 | 239 | s3_us(21) | ds_s3(21) | 22.5 |
| 102 | 240 | s3_us(22) | ds_s3(22) | 23.5 |
| 103 | 241 | GND | GND | 24.5 |
| 104 | 242 | 1.8V | 1.8V | 25.5 |
| 105 | 243 | us_s3(12) | s3_ds(12) | 26.5 |
| 106 | 244 | us_s3(13) | s3_ds(13) | 27.5 |
| 107 | 245 | GND | GND | 28.5 |
| 108 | 246 | 1.8V | 1.8V | 29.5 |
| 109 | 247 | us_s3(14) | s3_ds(14) | 30.5 |
| 110 | 248 | us_s3(15) | s3_ds(15) | 31.5 |
| 111 | 249 | GND | GND | 32.5 |
| 110 | 250 | 1.8V | 1.8V | 33.5 |
| 113 | 251 | us_s3_clk_n | us_s3_clk_n_r | 34.5 |
| 114 | 252 | us_s3_clk_p | us_s3_clk_p_r | 35.5 |
| 115 | 253 | s3_ds_clk_n | s3_ds_clk_n_r | 36.6 |
| 116 | 254 | s3_ds_clk_p | s3_ds_clk_p_r | 37.5 |
| 117 | 255 | GND | GND | 38.5 |
| 118 | 256 | 1.8V | 1.8V | 39.5 |
| 116 | 257 | us_s3(16) | s3_ds(16) | 40.5 |
| 120 | 258 | us_s3(17) | s3_ds(17) | 41.5 |
| 121 | 259 | GND | GND | 42.5 |
| 122 | 260 | 1.8V | 1.8V | 43.5 |
| 123 | 261 | us_s3(18) | s3_ds(18) | 44.5 |
| 124 | 262 | us_s3(19) | s3_ds(19) | 45.5 |
| 125 | 263 | GND | GND | 46.5 |
| 126 | 264 | 1.8V | 1.8V | 47.5 |
| 127 | 265 | us_s3(20) | s3_ds(20) | 48.5 |
| 128 | 266 | us_s3(21) | s3_ds(21) | 49.5 |
| 129 | 267 | GND | GND | 50.5 |
| 130 | 268 | 1.8V | 1.8V | 51.5 |
| 131 | 269 | rfu2 | rfu2_r | 52.5 |
| 132 | 270 | power_sns | power_sns_r | 53.5 |
| 133 | 271 | serv_ifc(15) | serv_ifc(15)_r | 54.5 |
| 134 | 272 | i2c_scl | i2c_scl_r | 55.5 |
| 135 | 273 | i2c_sda | i2c_sda_r | 56.5 |
| 136 | 274 | serv_ifc(16) | serv_ifc(17) | 57.5 |
| 137 | 275 | VTT | VTT | 58.5 |
| 138 | 276 | Continutity(1) | 1.8V | 59.5 Distance To right of notch (front view) |

FIG. 15b

276-PIN BUFFERED MEMORY MODULE WITH ENHANCED FAULT TOLERANCE

BACKGROUND OF THE INVENTION

The invention relates to computer memory subsystems and, more particularly, to a buffered memory module having enhanced fault tolerance.

Computer memory subsystems have evolved over the years, but continue to retain many consistent attributes. Computer memory subsystems from the early 1980's, such as the one disclosed in U.S. Pat. No. 4,475,194 to LeVallee et al, of common assignment herewith, included a memory controller, a memory assembly (contemporarily called a basic storage module (BSM) by the inventors) with array devices, buffers, terminators and ancillary timing and control functions, as well as several point-to-point busses to permit each memory assembly to communicate with the memory controller via its own point-to-point address and data bus. FIG. 1 depicts an example of this early 1980 computer memory subsystem with two BSMs, a memory controller, a maintenance console, and point-to-point address and data busses connecting the BSMs and the memory controller.

FIG. 2, from U.S. Pat. No. 5,513,135 to Dell et al, of common assignment herewith, depicts an early synchronous memory module, which includes synchronous dynamic random access memories (DRAMs) 8, buffer devices 12, an optimized pinout, an interconnect and a capacitive decoupling method to facilitate operation. The patent also describes the use of clock re-drive on the module, using such devices as phase lock loops (PLLs).

FIG. 3, from U.S. Pat. No. 6,510,100 to Grundon et al, of common assignment herewith, depicts a simplified diagram and description of a memory subsystem 10 that includes up to four registered dual inline memory modules (DRAMs) 40 on a traditional multi-drop stub bus channel. The subsystem includes a memory controller 20, an external clock buffer 30, registered DIMMs 40, address bus 50, control bus 60 and a data bus 70 with terminators 95 on the address bus 50 and data bus 70.

FIG. 4 depicts a 1990's memory subsystem which evolved from the structure in FIG. 1 and included a memory controller 402, one or more high speed point-to-point channels 404, each connected to a bus-to-bus converter chip 406, and each having a synchronous memory interface 408 that enables connection to one or more registered DIMMs 410. In this implementation, the high speed, point-to-point channel 404 operated at twice the DRAM data rate, allowing the bus-to-bus converter chip 406 to operate one or two registered DIMM memory channels at the full DRAM data rate. Each registered DIMM included a PLL, registers, DRAMs, an electrically erasable programmable read-only memory (EEPROM) and terminators, in addition to other passive components.

As shown in FIG. 5, memory subsystems were often constructed with a memory controller connected either to a single memory module, or to two or more memory modules interconnected on a 'stub' bus. FIG. 5 is a simplified example of a multi-drop stub bus memory structure, similar to the one shown in FIG. 3. This structure offers a reasonable tradeoff between cost, performance, reliability and upgrade capability, but has inherent limits on the number of modules that may be attached to the stub bus. The limit on the number of modules that may be attached to the stub bus is directly related to the data rate of the information transferred over the bus. As data rates increase, the number and length of the stubs must be reduced to ensure robust memory operation. Increasing the speed of the bus generally results in a reduction in modules on the bus, with the optimal electrical interface being one in which a single module is directly connected to a single controller, or a point-to-point interface with few, if any, stubs that will result in reflections and impedance discontinuities. As most memory modules are sixty-four or seventy-two bits in data width, this structure also requires a large number of pins to transfer address, command, and data. One hundred and twenty pins are identified in FIG. 5 as being a representative pincount.

FIG. 6, from U.S. Pat. No. 4,723,120 to Petty, of common assignment herewith, is related to the application of a daisy chain structure in a multipoint communication structure that would otherwise require multiple ports, each connected via point-to-point interfaces to separate devices. By adopting a daisy chain structure, the controlling station can be produced with fewer ports (or channels), and each device on the channel can utilize standard upstream and downstream protocols, independent of their location in the daisy chain structure.

FIG. 7 represents a daisy chained memory bus, implemented consistent with the teachings in U.S. Pat. No. 4,723,120. The memory controller is connected to a memory bus 315, which further connects to module 310a. The information on bus 315 is re-driven by the buffer on module 310a to the next module, 310b, which further re-drives the bus 315 to module positions denoted as 310n. Each module 310a includes a DRAM 311a and a buffer 320a. The bus 315 may be described as having a daisy chain structure, with each bus being point-to-point in nature.

As new systems emerge which offer enhanced performance, improved reliability and/or reduced power consumption, customers will often replace existing systems with these new systems. To reduce total purchase cost, however, many may wish to re-use many or all of their storage devices in the new system—often in conjunction with the new storage technology of that system, in order to take advantage of the increased speed and density. At the same time, it is also desirable to be able to provide the high-speed, high-density storage capability in a reliable manner that is resistant to faults such as pin discontinuity, single points-of-failure, and other related faults, as well as supporting increased DRAM body widths therein.

BRIEF SUMMARY OF THE INVENTION

Exemplary embodiments of the present invention include a dual inline memory module (DIMM) including a card having a length of about 151.2 to about 151.5 millimeters, a plurality of individual local memory devices attached to the card, and a buffer device attached to the card, the buffer device configured for converting a packetized memory interface. The card includes at least 276 pins configured thereon.

Further exemplary embodiments include a dual inline memory module (DIMM), including a card having a length of about 151.35 millimeters, a plurality of individual local memory devices attached to the card, and a buffer device attached to the card. The buffer device is configured to re-drive information to one or more external memory modules in a cascaded manner, and at least one positioning key is formed on the card.

Further exemplary embodiments include a computer memory system, including a memory controller device, a first dual inline memory module (DIMM) coupled to the memory controller device through a set of at least two single-ended busses, the first DIMM including a card having a length of about 151.2 to about 151.5 millimeters, a plurality of individual local memory devices attached to the card, and a buffer device attached to the card. The buffer device is configured for converting a packetized memory interface. Error code correction (ECC) logic is further included for identifying and correcting bus faults, and a set of at least two high-speed busses connects the first DIMM to at least one of the memory controller device and a second DIMM.

Additional exemplary embodiments include a computer memory system, including a dual inline memory module (DIMM) including a card having a length of about 151.2 to about 151.5 millimeters, a plurality of individual local memory devices attached to the card, and a buffer device attached to the card, the buffer device configured for converting a packetized memory interface. A plurality of high-speed busses are in communication with the DIMM for implementing a cascade connection to upstream and downstream devices with respect to the DIMM. The DIMM further includes a plurality of high-speed bus interface pins arranged on the card, such that for a given high-speed bus, a first portion of the high-speed bus interface pins associated therewith is located one side of the card, with respect to a midpoint of the length, and a second portion of said high-speed bus interface pins associated therewith is located on the opposite side of the card, with respect to the midpoint.

Additional exemplary embodiments include a dual inline memory module (DIMM), including a card having a length of about 151.2 to about 151.5 millimeters, a plurality of individual local memory devices attached to the card, and a buffer device attached to the card, the buffer device configured for converting a packetized memory interface. The card includes at least 276 pins configured thereon, wherein a first portion of the pins is configured to operate at a first supply voltage, and a second portion of the pins is configured to operate at a second supply voltage.

BRIEF DESCRIPTION OF THE DRAWINGS

Referring now to the drawings wherein like elements are numbered alike in the several FIGURES:

FIG. 12 is a table that includes typical applications and operating modes of exemplary buffer devices;

FIG. 15 is a table illustrating a functional pin layout of the exemplary 276-pin DIMM of FIG. 10, in accordance with a further embodiment of the invention.

DETAILED DESCRIPTION OF THE PREFERRED EMBODIMENTS

Exemplary embodiments of the present invention include a flexible, high speed and high reliability memory system architecture and interconnect structure that includes a single-ended point-to-point interconnection between any two high speed communication interfaces. The memory subsystem may be implemented in one of several structures, depending on desired attributes such as reliability, performance, density, space, cost, component re-use and other elements. A bus-to-bus converter chip enables this flexibility through the inclusion of multiple, selectable memory interface modes. This maximizes the flexibility of the system designers in defining optimal solutions for each installation, while minimizing product development costs and maximizing economies of scale through the use of a common device. In addition, exemplary embodiments of the present invention provide a migration path that allows an installation to implement a mix of buffered memory modules and unbuffered and/or registered memory modules from a common buffer device.

Memory subsystems may utilize a buffer device to support buffered memory modules (directly connected to a memory controller via a packetized, multi-transfer interface with enhanced reliability features) and/or existing unbuffered or registered memory modules (in conjunction with the identical buffer device, on an equivalent but, programmed to operate in a manner consistent with the memory interface defined for those module types). A memory subsystem may communicate with buffered memory modules at one speed and with unbuffered and registered memory modules at another speed (typically a slower speed). Many attributes associated with the buffered module structure are maintained, including the enhanced high speed bus error detection and correction features and the memory cascade function. However, overall performance may be reduced when communicating with most registered and unbuffered DIMMs due to the net topologies and loadings associated with them.

Figure 1:
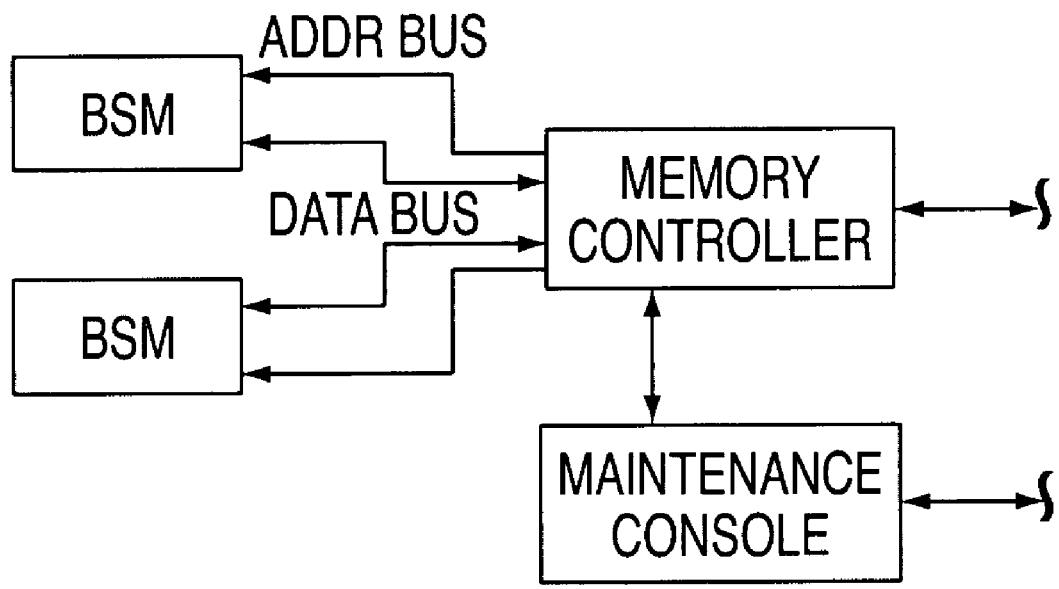
FIG. 1 depicts a prior art memory controller connected to two buffered memory assemblies via separate point-to-point links.
Figure 2:
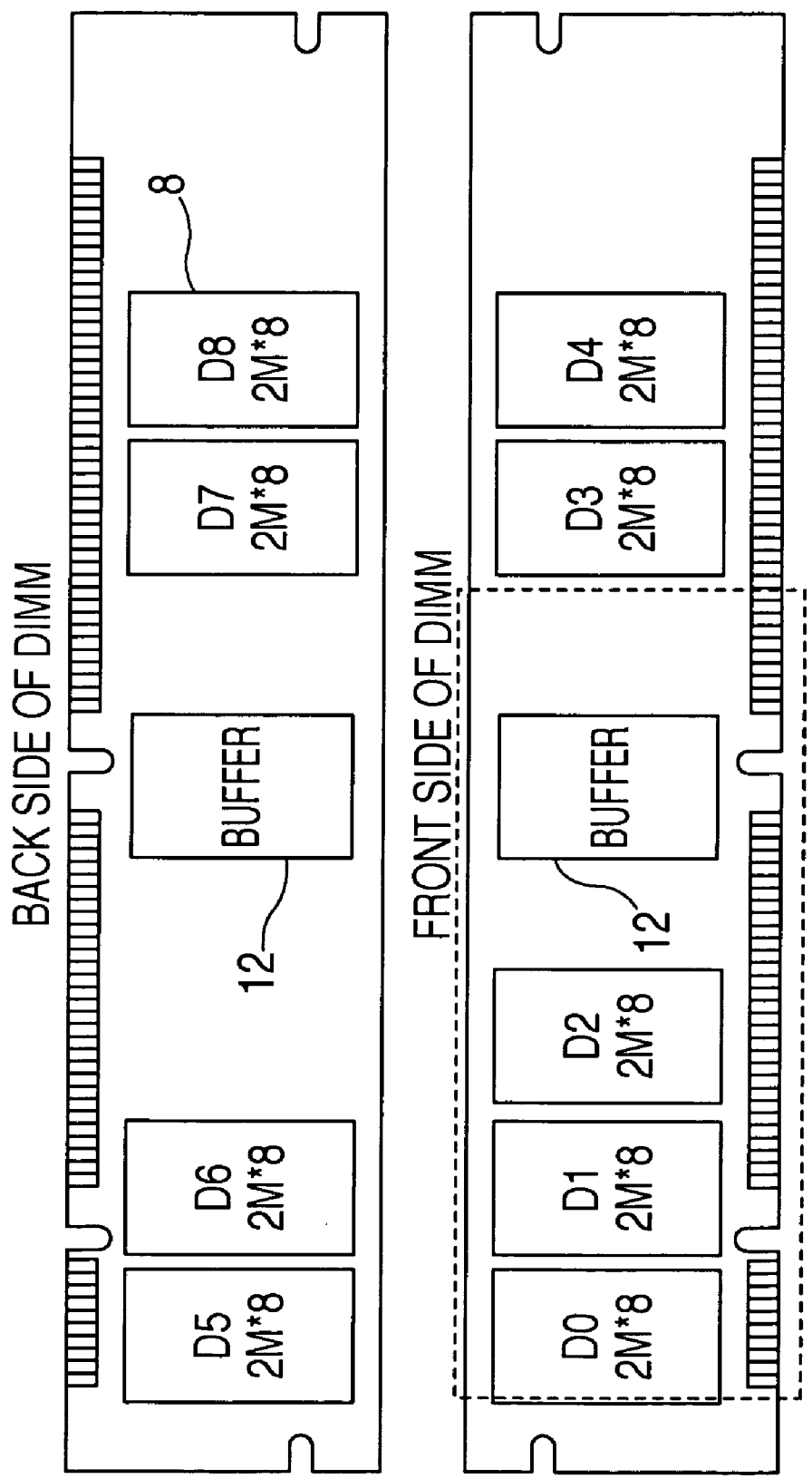
FIG. 2 depicts a prior art synchronous memory module with a buffer device.
Figure 3:
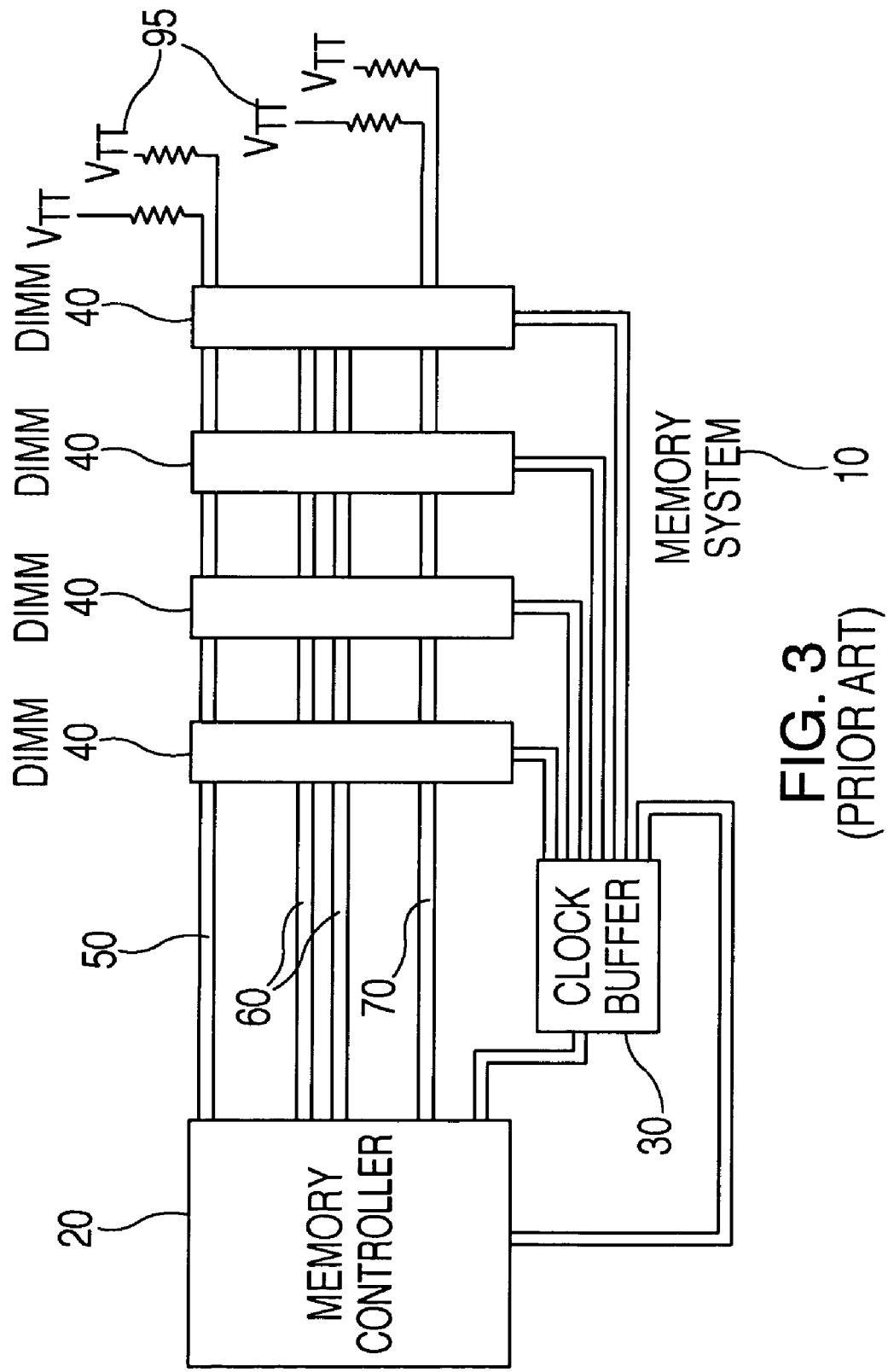
FIG. 3 depicts a prior art memory subsystem using registered DIMMs.
Figure 4:
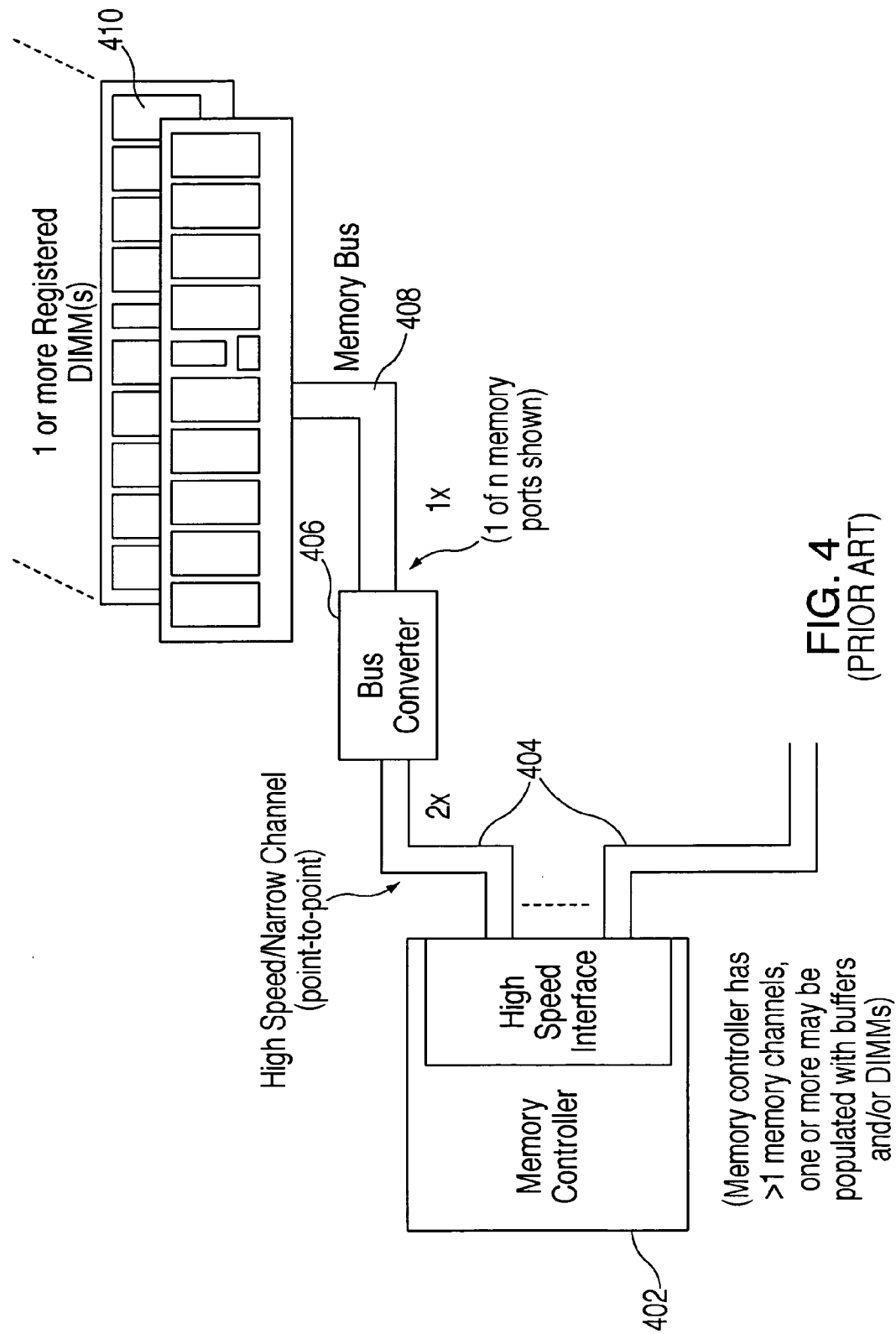
FIG. 4 depicts a prior art memory subsystem with point-to-point channels, registered DIMMs, and a 2:1 bus speed multiplier
Figure 5:
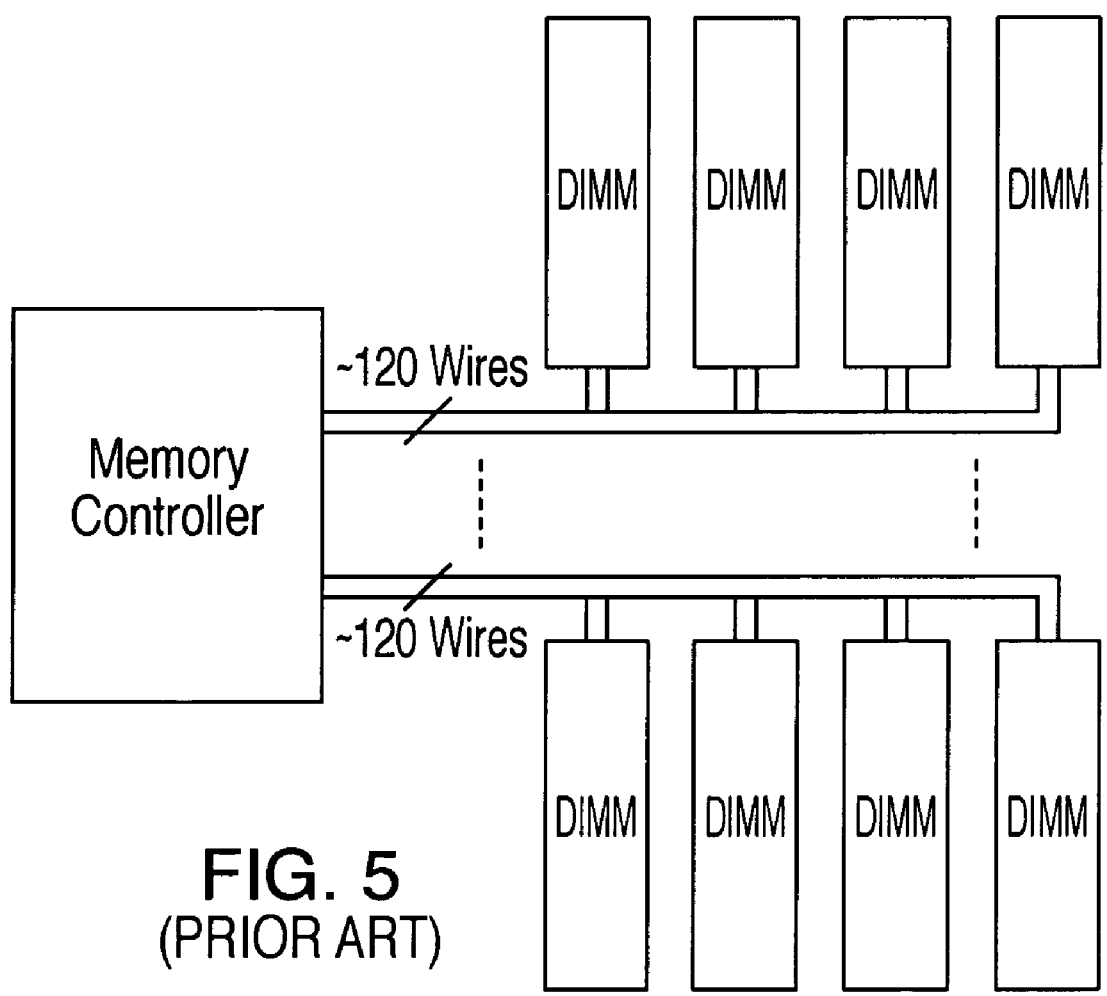
FIG. 5 depicts a prior art memory structure that utilizes a multidrop memory 'stub' bus.
Figure 6:
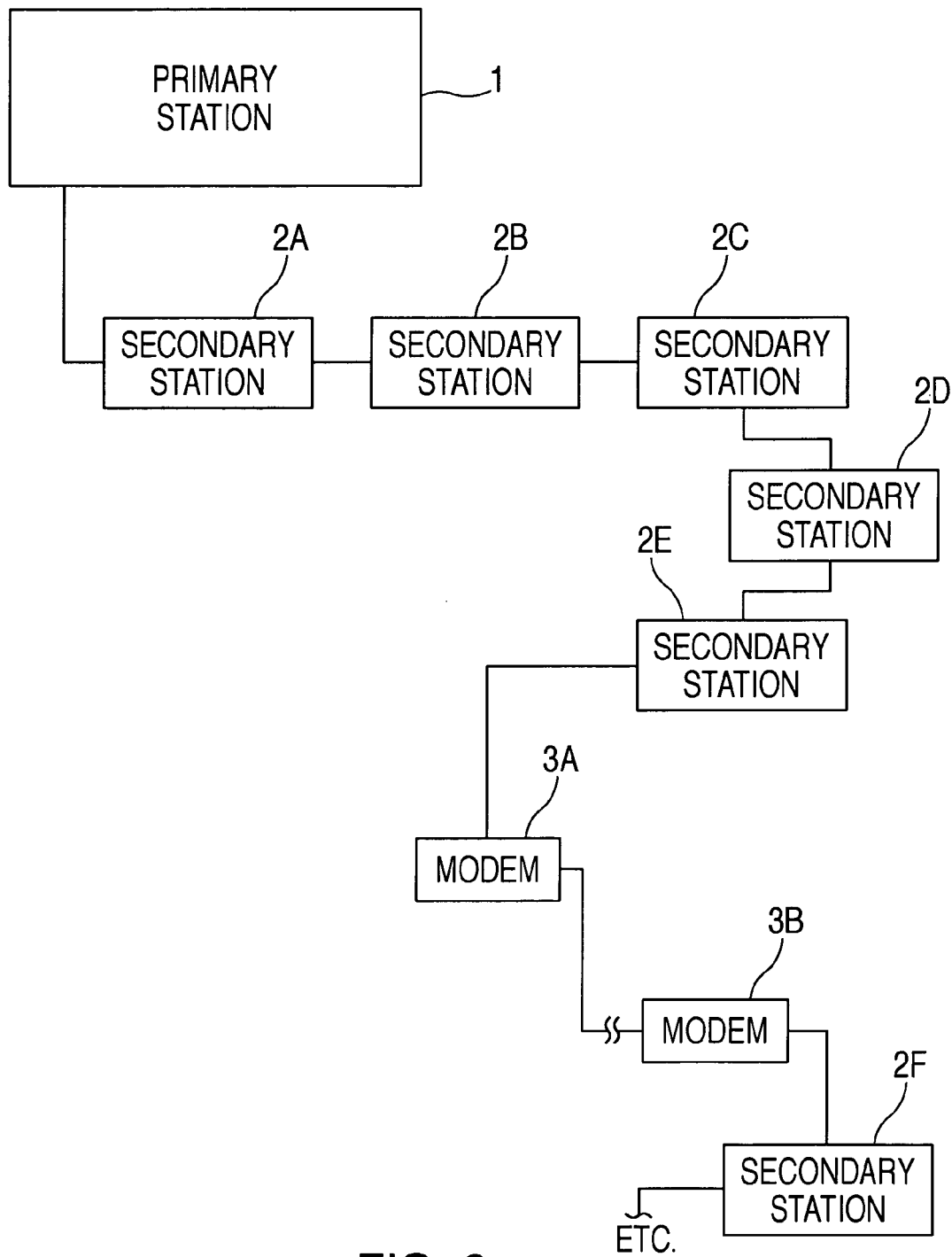
FIG. 6 depicts a prior art daisy chain structure in a multipoint communication structure that would otherwise require multiple ports.
Figure 7:
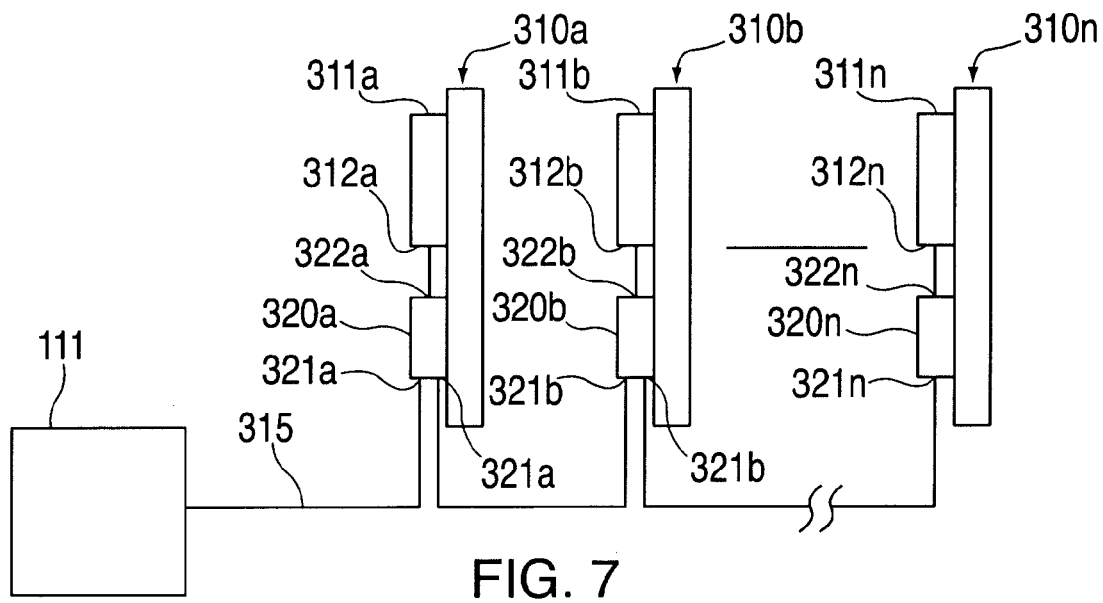
FIG. 7 depicts a prior art daisy chain connection between a memory controller and memory modules.
Figure 8:
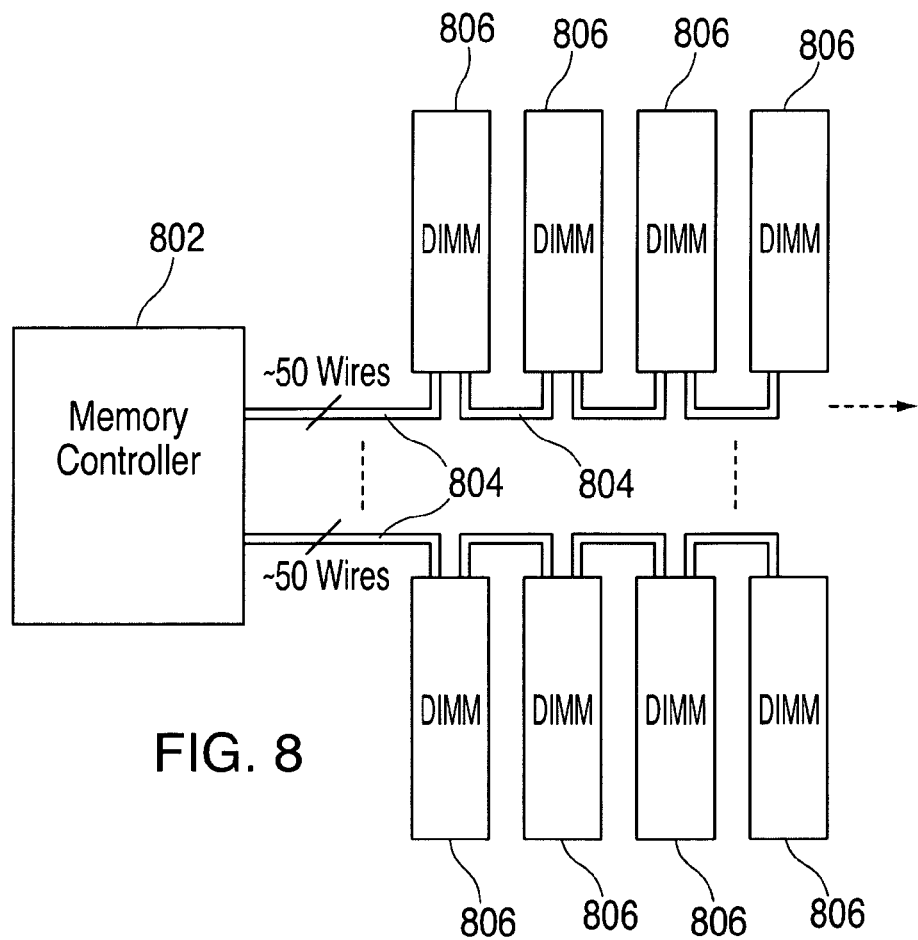
FIG. 8 depicts a cascaded memory structure that is utilized by exemplary embodiments of the present invention.

FIG. 8 depicts a cascaded memory structure that may be utilized by exemplary embodiments of the present invention when buffered memory modules 806 (e.g., the buffer device is included within the memory module 806) are in communication with the memory controller 802. This memory structure includes a memory controller 802 in communication with one or more memory modules 806 via a high speed point-to-point bus 804. Each bus 804 in the exemplary embodiment depicted in FIG. 8 includes approximately fifty high speed wires for the transfer of address, command, data and clocks. By using point-to-point busses as described in the aforementioned prior art, it is possible to optimize the bus design to permit significantly increased data rates, as well as to reduce the bus pincount by transferring data over multiple cycles. Whereas FIG. 4 depicts a memory subsystem with a two to one ratio between the data rate on any one of the busses connecting the memory controller to one of the bus converters (e.g., to 1,066 Mb/s per pin) versus any one of the busses between the bus converter and one or more memory modules (e.g., to 533 Mb/s per pin), an exemplary embodiment of the present invention, as depicted in FIG. 8, provides a four to one bus speed ratio to maximize bus efficiency and minimize pincount.

Although point-to-point interconnects permit higher data rates, overall memory subsystem efficiency must be achieved by maintaining a reasonable number of memory modules 806 and memory devices per channel (historically four memory modules with four to thirty-six chips per memory module, but as high as eight memory modules per channel and as few as one memory module per channel). Using a point-to-point bus necessitates a bus re-drive function on each memory module, to permit memory modules to be cascaded such that each memory module is interconnected to other memory modules as well as to the memory controller 802.

Figure 9:
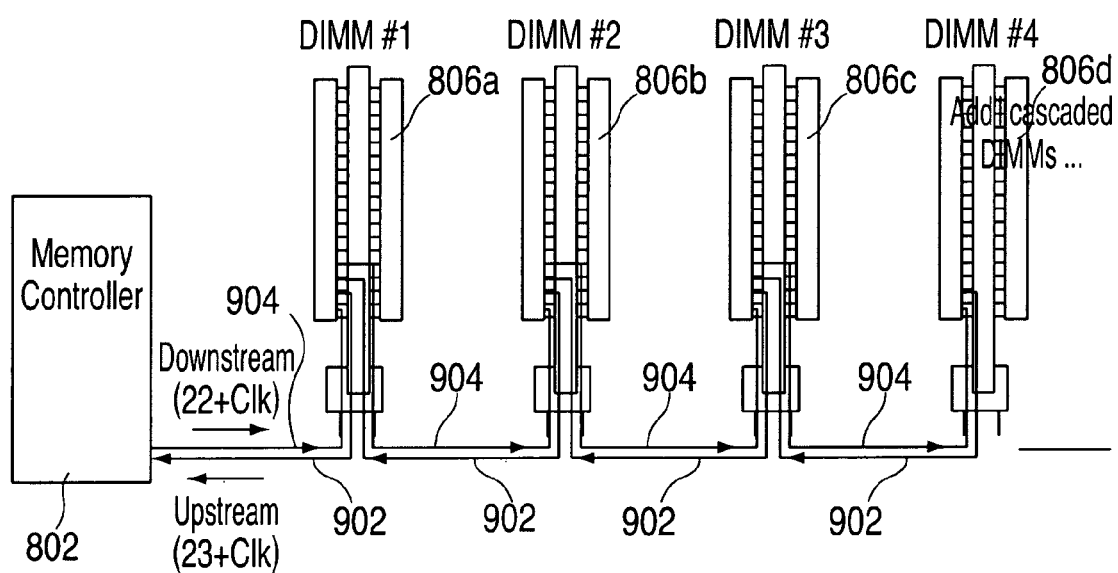
FIG. 9 depicts a memory structure with cascaded memory modules and unidirectional busses that is utilized by exemplary embodiments of the present invention.

FIG. 9 depicts a memory structure with cascaded memory modules and unidirectional busses that is utilized by exemplary embodiments of the present invention if all of the memory modules 806 are buffered memory modules 806. One of the functions provided by the memory modules 806 in the cascade structure is a redrive function to send signals on the memory bus to other memory modules 806 or to a memory controller 802. FIG. 9 includes a memory controller 802 and four memory modules 806a, 806b, 806c and 806d, on each of two memory busses (a downstream memory bus 904 and an upstream memory bus 902), connected to the memory controller 802 in either a direct or cascaded manner. Memory module 806a is connected to the memory controller 802 in a direct manner. Memory modules 806b, 806c and 806d are connected to the controller 802 in a cascaded manner.

An exemplary embodiment of the present invention includes two uni-directional busses between the memory controller 802 and memory module 806a ("DIMM #1") as well as between each successive memory module 806b–d ("DIMM #2", "DIMM #3" and "DIMM #4") in the cascaded memory structure. The downstream memory bus 904 is comprised of twenty-two single-ended signals and a differential clock pair. The downstream memory bus 904 is used to transfer address, control, data and error code correction (ECC) bits downstream from the memory controller 802, over several clock cycles, to one or more of the memory modules 806 installed on the cascaded memory channel. The upstream memory bus 902 is comprised of twenty-three single-ended signals and a differential clock pair, and is used to transfer bus-level data and ECC bits upstream from the sourcing memory module 806 to the memory controller 802. Using this memory structure, and a four to one data rate multiplier between the DRAM data rate (e.g., 400 to 800 Mb/s per pin) and the unidirectional memory bus data rate (e.g., 1.6 to 3.2 Gb/s per pin), the memory controller 802 signal pincount, per memory channel, is reduced from approximately one hundred and twenty pins to about fifty pins.

Figure 10:
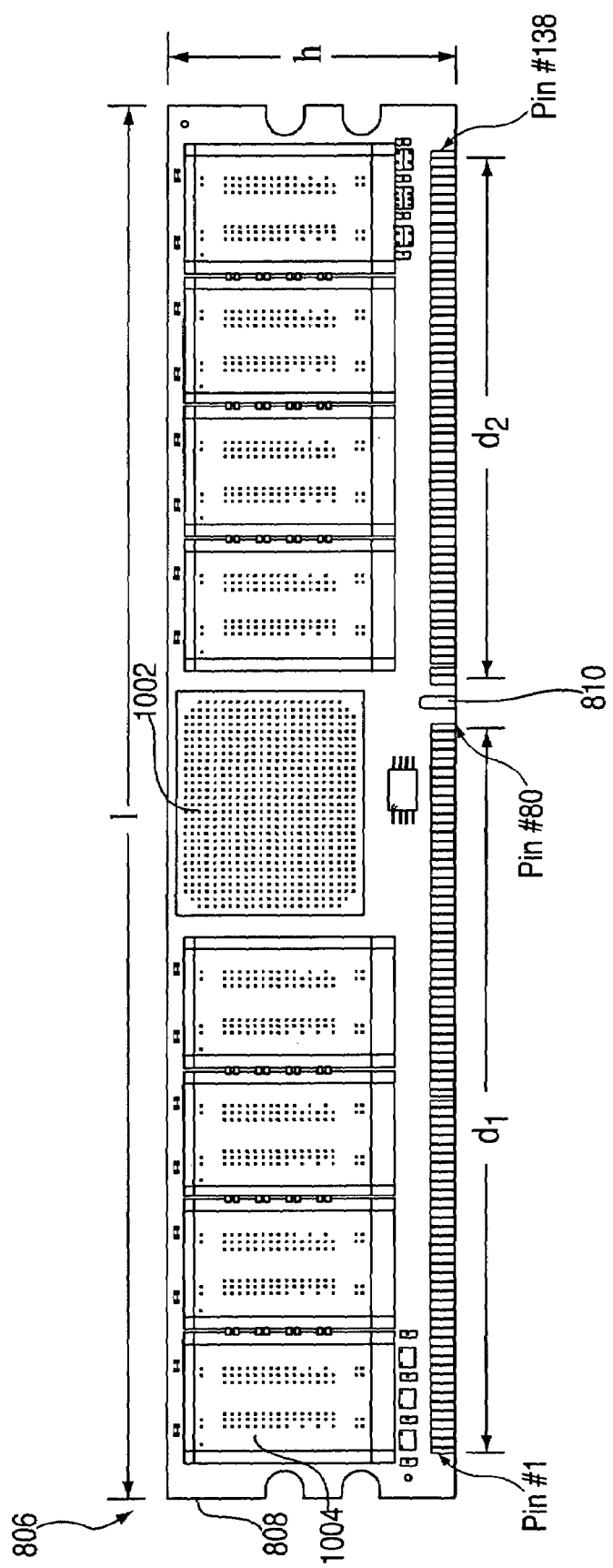
FIG. 10 is a front view of a 276-pin, buffered memory module (DIMM) that is utilized by exemplary embodiments of the present invention.

FIG. 10 depicts a front view 1006 and a back view 1008 of a buffered memory module 806 that is utilized by exemplary embodiments of the present invention. In exemplary embodiments of the present invention, each memory module 806 includes a blank card having dimensions of approximately six inches long by one and a half inches tall, eighteen DRAM positions, a multi-mode buffer device 1002, and numerous small components as known in the art that are not shown (e.g., capacitors, resistors, EEPROM.) In an exemplary embodiment of the present invention, the dimension of the card is 5.97 inches long by 1.2 inches tall. In an exemplary embodiment of the present invention, the multi-mode buffer device 1002 is located in the center region of the front side of the memory module 806, as depicted in the front view 1006 in FIG. 10. The synchronous DRAMS (SDRAMS) 1004 are located on either side of the multi-mode buffer device 1002, as well as on the backside of the memory module 806, as depicted in the back view 1008 in FIG. 10. The configuration may be utilized to facilitate high speed wiring to the multi-mode buffer device 1002 as well as signals from the buffer device to the SDRAMs 1004.

The DRAM package outline is a combination of a tall/narrow (i.e., rectangular) DRAM package and a short/wide (i.e., squarish) DRAM package. Thus configured, a single card design may accommodate either "tall" or "wide" DRAM device/package combinations, consistent with historical and projected device trends. Moreover, the buffer device 1002 is rectangular in shape, thereby permitting a minimum distance between high-speed package interconnects and the DIMM tab pins, as well as reducing the distance the high-speed signals must travel under the package to reach an available high-speed pin, when an optimal ground referencing structure is used.

As is also shown in FIG. 10, the location of a positioning key 810 (notch) is specifically shifted from the midpoint of the length, l, of the card 808 (with respect to prior generation models) in order to ensure the DIMM cannot be fully inserted into a connector intended for a different module type. In addition, the positioning key location also prevents reverse insertion of the DIMM, and allows for a visual aid to the end-user regarding proper DIMM insertion. In the example illustrated, the positioning key 810 is located between pins 80/218 and 81/219. As such, the distance $d_1$ along the length, l, of the card 808 is larger than the distance $d_2$.

Figure 11:
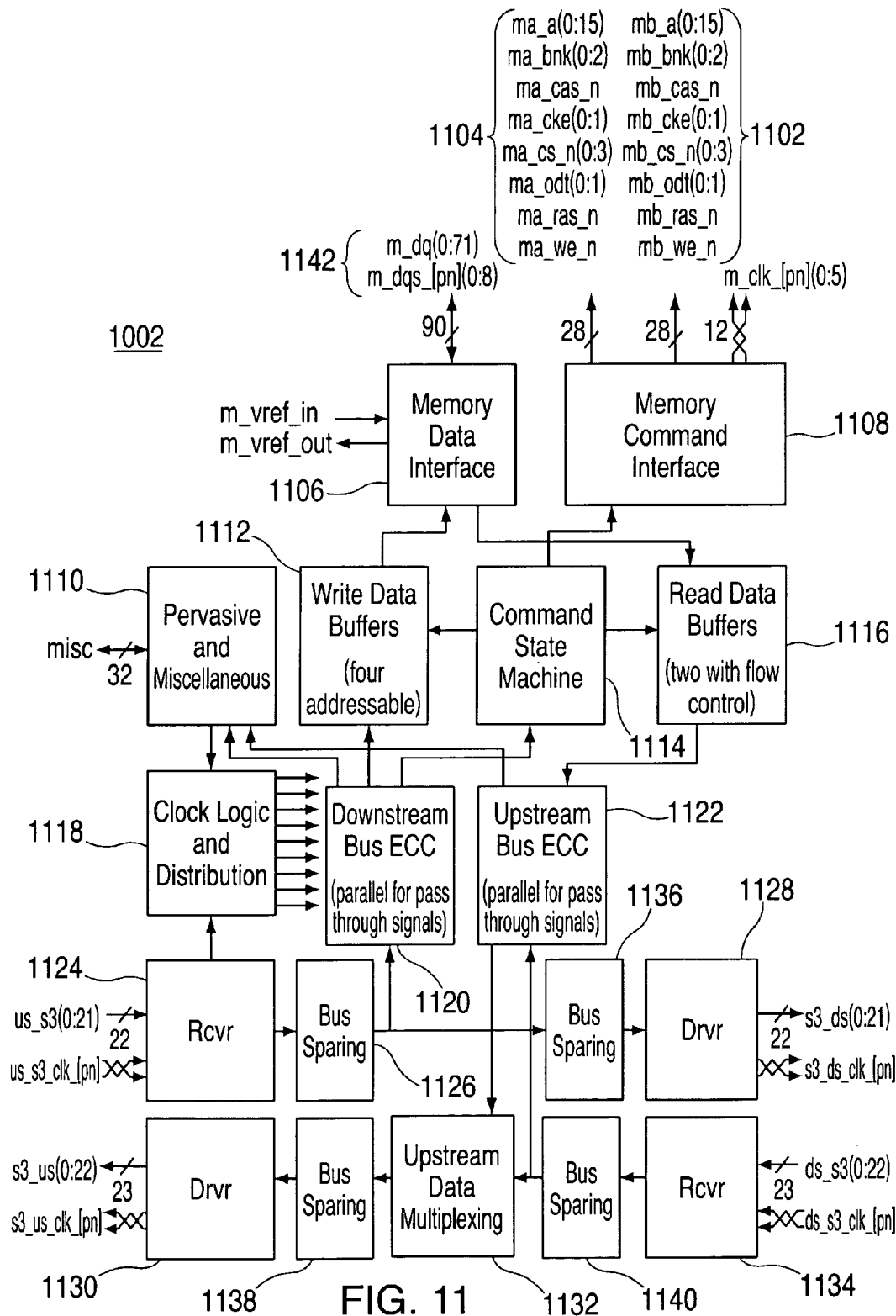
FIG. 11 is a block diagram of a multi-mode buffer device high level logic flow as utilized by exemplary embodiments of the present invention.

FIG. 11 is a block diagram of the high level logic flow of a multi-mode buffer device 1002 utilized by exemplary embodiments of the present invention. The multi-mode buffer device 1002 may be located on a memory module 806 as described previously and/or located on a system board or card to communicate with unbuffered and registered memory modules. The blocks in the lower left and right portions of the drawing (1124, 1128, 1130, 1134) are associated with receiving or driving the high speed bus 804. "Upstream" refers to the bus 902 passing information in the direction of the memory controller 802, and "downstream" refers to the bus 904 passing information away from the memory controller 802.

Referring to FIG. 11, data, command, address, ECC, and clock signals from an upstream memory assembly (i.e., a memory module 806) or a memory controller 802 are received from the downstream memory bus 904 into a receiver module 1124. The receiver functional block 1124 provides macros and support logic for the downstream memory bus 904 and, in an exemplary embodiment of the present invention includes support for a twenty-two bit, high speed, slave receiver bus. The receiver functional block 1124 transmits the clock signals to a clock logic and distribution functional block 1118 (e.g., to generate the four to one clock signals). The clock logic and distribution functional block 1118 also receives data input from the pervasive and miscellaneous signals 1110. These signals typically include control and setup information for the clock distriubtion PLL's, test inputs for BIST (built-in self-test) modes, programmable timing settings, etc. The receiver functional block 1124 transfers the data, command, ECC and address signals to a bus sparing logic block 1126 to reposition, when applicable, the bit placement of the data in the event that a spare wire utilized during the transmission from the previous memory assembly. In an exemplary embodiment of the present invention, the bus sparing logic block 1126 is implemented by a multiplexor to shift the signal positions, if needed. Next, the original or re-ordered signals are input to another bus sparing logic block 1136 to modify, or reorder if necessary, the signal placement to account for any defective interconnect that may exist between the current memory assembly and a downstream memory assembly. The original or re-ordered signals are then input to a driver functional block 1128 for transmission, via the downstream memory bus 904, to the next memory module 806 in the chain. In an exemplary embodiment of the present invention, the bus sparing logic 1136 is implemented using a multiplexor. The driver functional block 1128 provides macros and support logic for the downstream memory bus 904 and, in an exemplary embodiment of the present invention, includes support for the twenty-two bit, high speed, low latency cascade bus drivers.

In addition to inputting the original or re-ordered signals to the bus sparing logic 1136, the bus sparing logic 1126 also inputs the original or re-ordered signals into a downstream bus ECC functional block 1120 to perform error detection and correction for the frame. The downstream bus ECC functional block 1120 operates on any information received or passed through the multi-mode buffer device 1002 from the downstream memory bus 904 to determine if a bus error is present. The downstream bus ECC functional block 1120 analyzes the bus signals to determine if it they are valid. Next, the downstream bus ECC functional block 1120 transfers the corrected signals to a command state machine 1114. The command state machine 1114 inputs the error flags associated with command decodes or conflicts to a pervasive and miscellaneous functional block 1110. The downstream and upstream modules also present error flags and/or error data (if any) to the pervasive and miscellaneous functional block 1110 to enable reporting of these errors to the memory controller, processor, service processor or other error management unit.

Referring to FIG. 11, the pervasive and miscellaneous functional block 1110 transmits error flags and/or error data to the memory controller 802. By collecting error flags and/or error data from each memory module 806 in the chain, the memory controller 802 will be able to identify the failing segment(s), without having to-initiate further diagnostics, though additional diagnostics may be completed in some embodiments of the design. In addition, once an installation selected threshold (e.g., one, two, ten, or twenty) for the number of failures or type of failures has been reached, the pervasive and miscellaneous functional block 1110, generally in response to inputs from the memory controller 802, may substitute the spare wire for the segment that is failing. In an exemplary embodiment of the present invention, error detection and correction is performed for every group of four transfers, thereby permitting operations to be decoded and initiated after half of the eight transfers, comprising a frame, are received. The error detection and correction is performed for all signals that pass through the memory module 806 from the downstream memory bus 904, regardless of whether the signals are to be processed by the particular memory module 806. The data bits from the corrected signals are input to the write data buffers 1112 by the downstream bus ECC functional block 1120.

The command state machine 1114 also determines if the corrected signals (including data, command and address signals) are directed to and should be processed by the memory module 806. If the corrected signals are directed to the memory module 806, then the command state machine 1114 determines what actions to take and may initiate DRAM action, write buffer actions, read buffer actions or a combination thereof. Depending on the type of memory module 806 (buffered, unbuffered, registered), the command state machine 1114 selects the appropriate drive characteristics, timings and timing relationships. The write data buffers 1112 transmit the data signals to a memory data interface 1106 and the command state machine 1114 transmits the associated addresses and command signals to a memory command interface 1108, consistent with the DRAM specification. The memory data interface 1106 reads from and writes memory data 1142 to a memory device.

Data signals to be transmitted to the memory controller 802 may be temporarily stored in the read data buffers 1116 after a command, such as a read command, has been executed by the memory module 806, consistent with the memory device 'read' timings. The read data buffers 1116 transfer the read data into an upstream bus ECC functional block 1122. The upstream bus ECC functional block 1122 generates check bits for the signals in the read data buffers 1116. The check bits and signals from the read data buffers 1116 are input to the upstream data multiplexing functional block 1132. The upstream data multiplexing functional block 1132 merges the data on to the upstream memory bus 902 via the bus sparing logic 1138 and the driver functional block 1130. If needed, the bus sparing logic 1138 may re-direct the signals to account for a defective segment between the current memory module 806 and the upstream receiving module (or memory controller). The driver functional block 1130 transmits the original or re-ordered signals, via the upstream memory bus 902, to the next memory assembly (i.e., memory module 806) or memory controller 802 in the chain. In an exemplary embodiment of the present invention, the bus sparing logic 1138 is implemented using a multiplexor to shift the signals. The driver functional block 1130 provides macros and support logic for the upstream memory bus 902 and, in an exemplary embodiment of the present invention, includes support for a twenty-three bit, high speed, low latency cascade driver bus.

Data, clock and ECC signals from the upstream memory bus 902 are also received by any upstream multi-mode buffer device 1002 in any upstream memory module 806. These signals need to be passed upstream to the next memory module 806 or to the memory controller 802. Referring to FIG. 11, data, ECC and clock signals from a downstream memory assembly (i.e., a memory module 806) are received on the upstream memory bus 902 into a receiver functional block 1134. The receiver functional block 1134 provides macros and support logic for the upstream memory bus 902 and, in an exemplary embodiment of the present invention includes support for a twenty-three bit, high speed, slave receiver bus. The receiver functional block 1134 passes the data and ECC signals, through the bus sparing functional block 1140, to the upstream data multiplexing functional block 1132 and then to the bus sparing logic block 1138. The signals are transmitted to the upstream memory bus 902 via the driver functional block 1130.

In addition to passing the data and ECC signals to the upstream data multiplexing functional block 1132, the bus sparing functional block 1140 also inputs the original or re-ordered data and ECC signals to the upstream bus ECC functional block 1122 to perform error detection and correction for the frame. The upstream bus ECC functional block 1122 operates on any information received or passed through the multi-mode buffer device 1002 from the upstream memory bus 902 to determine if a bus error is present. The upstream bus ECC functional block 1122 analyzes the data and ECC signals to determine if they are valid. Next, the upstream bus ECC functional block 1122 transfers any error flags and/or error data to the pervasive and miscellaneous functional block 1110 for transmission to the memory controller 802. In addition, once a pre-defined threshold for the number or type of failures has been reached, the pervasive and miscellaneous functional block 1110, generally in response to direction of the memory controller 802, may substitute the spare segment for a failing segment.

The block diagram in FIG. 11 is one implementation of a multi-mode buffer device 1002 that may be utilized by exemplary embodiments of the present invention. Other implementations are possible without departing from the scope of the present invention.

FIG. 12 is a table that includes typical applications and operating modes of exemplary buffer devices. Three types of buffer modes 1208 are described: buffered DIMM 1202; registered DIMM 1204; and unbuffered DIMM 1206. The "a" and "b" bus that are output from the memory command interface 1108 can be logically configured to operate in one or more of these modes depending on the application. The table includes: a ranks column 1210 that contains the number of ranks per DIMM; a chip select (CS) column that contains the number of buffer CS outputs used, in addition to the loads per CS; a clock column 1214 that contains the number of buffer clock pairs used and the loads per clock pair; and a miscellaneous column 1216 that includes wiring topology information. A load refers to a receiver input to a DRAM, register, buffer, PLL or appropriate device on the memory module 806.

As indicated in FIG. 12, the buffered DIMM implementation supports up to nine memory devices per rank, with each device having an eight bit interface (seventy-two bits total). If all eight ranks are populated on a given module constructed of current one gigabit devices, the total memory density of the module will be eight gigabytes. As evident by the table entries under the CS column 1212 (the CS is generally utilized on DIMMs as a rank select to activate all the memory devices in the rank) and the clock column 1214, the varying loads and net structures require different driver characteristics (e.g., drive strength) for the multi-mode buffer device 1002. In addition, as the registered DIMMs generally add a single clock delay on all inputs that pass through the register on the DIMM (address and command inputs), the multi-mode buffer device 1002 needs to accommodate the extra clock of latency by ensuring accurate address and command-to-data timings. Further, the unbuffered DIMMs, as well as the heavily loaded buffered DIMM applications often require two-transition (2T) addressing, due to heavy loading on address and certain command lines (such as row address strobe (RAS), column address strobe (CAS) and write enable (WE)). In the latter case, the buffer operates such that these outputs are allowed two clock cycles to achieve and maintain a valid level prior to the CS pin being driven low to capture these DRAM inputs and initiate a new action.

The terms "net topology" in FIG. 12 refer to a drawing and/or textual description of a wiring interconnect structure between two or more devices. A "fly-by-topology" is a wiring interconnect structure in which the source (driver) is connected to two or more devices that are connected along the length of a wire, that is generally terminated at the far end, where the devices along the wire receive the signal from the source at a time that is based on the flight time through the wire and the distance from the source. A "T" net topology is a wiring interconnect structure that includes a source (driver) that is connected to two or more devices through a wire that branches or splits. Each branch or split is intended to contain similar wire length and loading. In general, a single wire will split into two branches from a single branch point, with each branch containing similar line length and loading. Inputs wired to a single register or clock are generally considered to be point-to-point. Inputs wired to multiple registers or PLLs are generally wired in a "T" net structure so that each receiver receives the input at approximately the same time, with a similar waveform. The "T" nets defined above are typically not end-terminated, but generally include a series resistor termination in the wire segment prior to the branch point.

Figure 13:
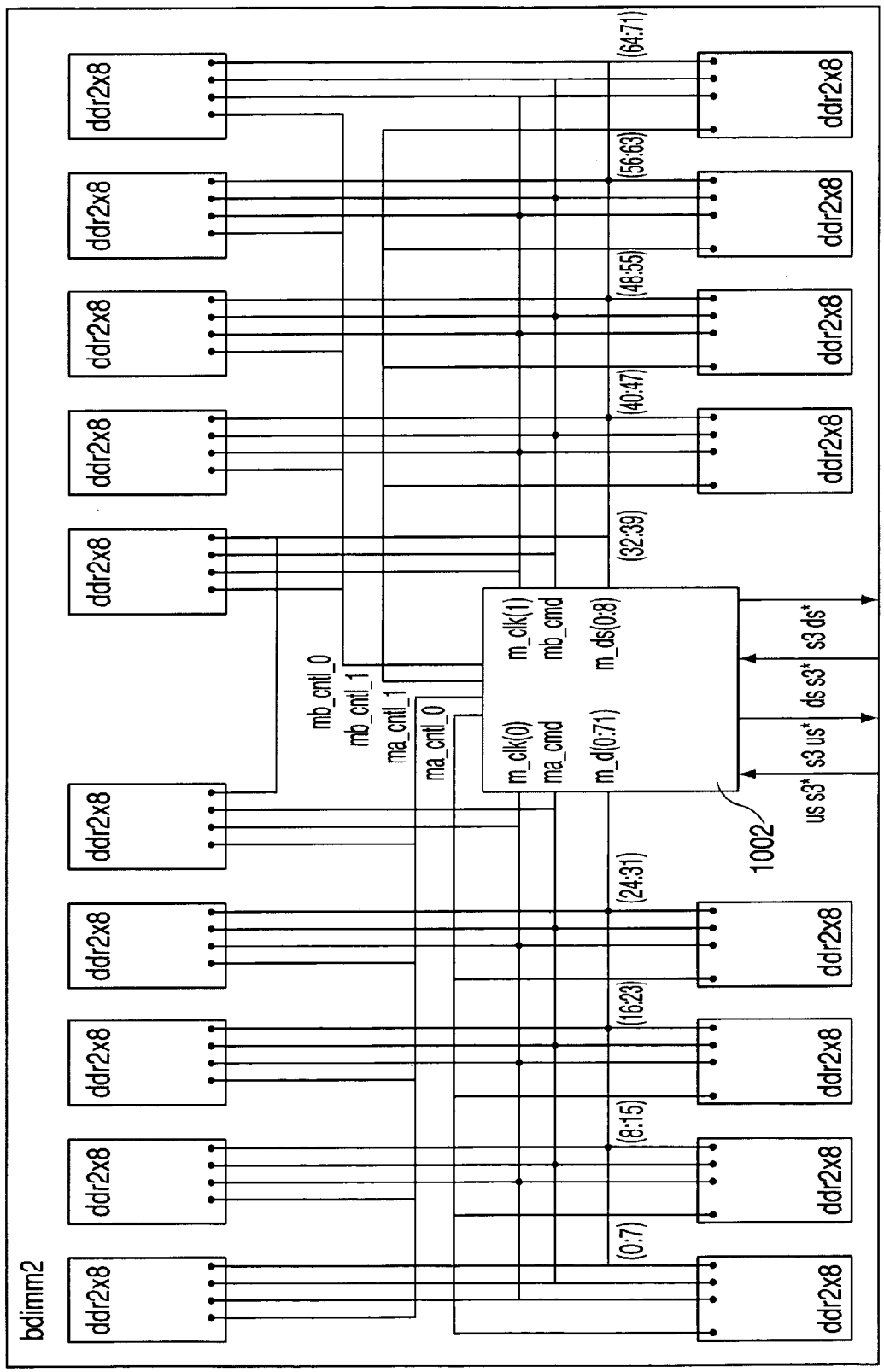
FIG. 13 is a simplified block diagram of a buffered DIMM produced with a multi-mode buffer device that may be utilized by exemplary embodiments of the present invention.

FIG. 13 is a simplified block diagram of a buffered DIMM memory module with the multi-mode buffer device 1002 that may be utilized by exemplary embodiments of the present invention. It provides an example of the net structures and loading associated with a two rank buffered DIMM produced with eighteen DDR2 eight bit memory devices, consistent with the information in the table in FIG. 12. The CS and clock signals are wired in a fly-by structure, the lines shown in the drawing from the mainline wire to each memory device appear to be long only to simplify the drawing. The fly-by net end-termination is not shown, but is included in the exemplary embodiment.

Figure 14:
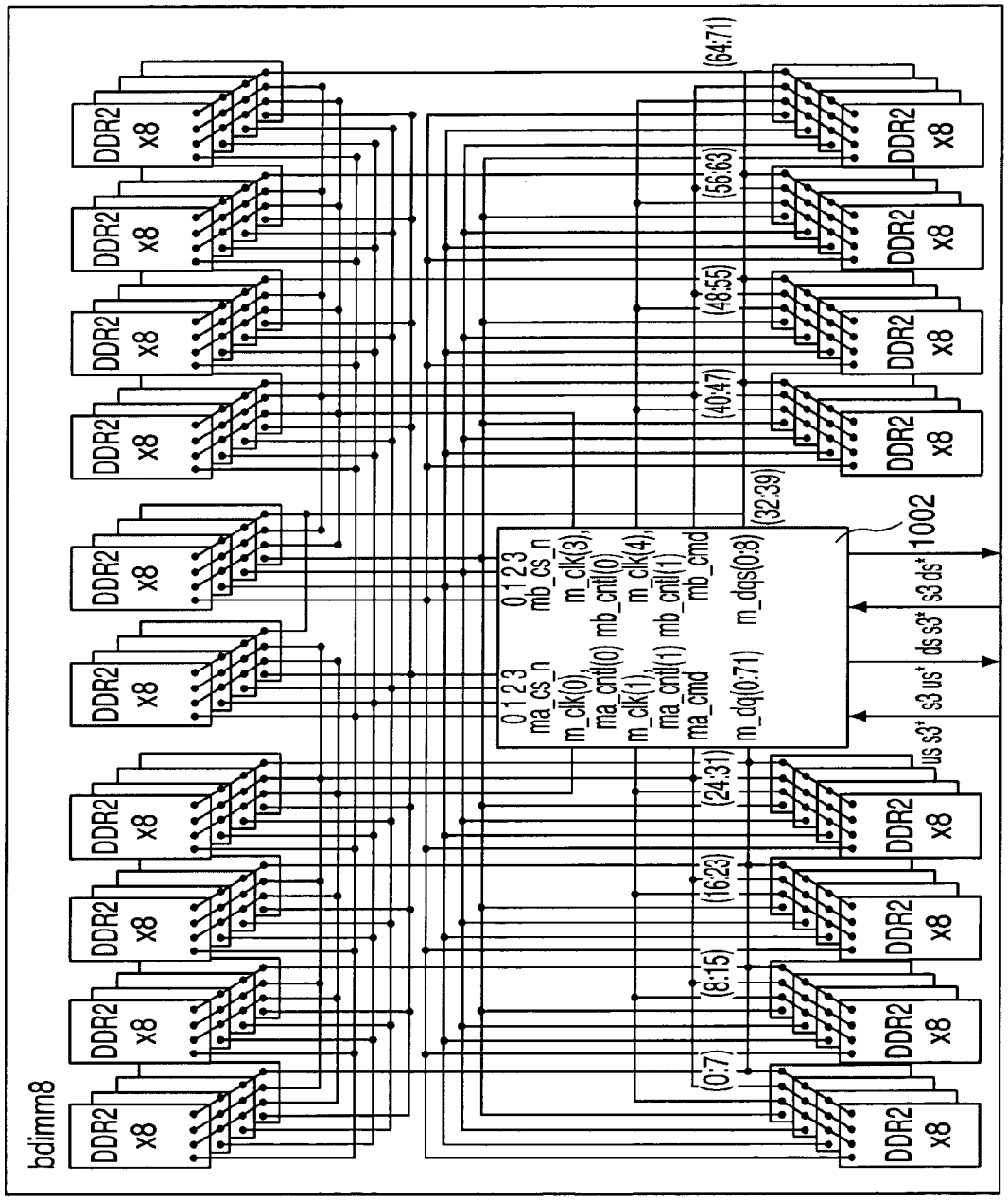
FIG. 14 is a simplified block diagram of a buffered DIMM produced with a multi-mode buffer device that may be utilized by exemplary embodiments of the present invention.

FIG. 14 is a simplified block diagram of a buffered DIMM memory module 806 produced with a multi-mode buffer device 1002 that may be utilized by exemplary embodiments of the present invention. It provides an example of the net structures and loading associated with an eight rank buffered DIMM memory module 806 produced with eight bit memory devices, consistent with the information in the table in FIG. 12. Each CS output controls nine memory devices (seventy-two bits) in this example, whereas each CS controls four or five (thirty-two to forty bits) in FIG. 13.

Finally, FIG. 15 is a table illustrating a functional pin layout of the exemplary 276-pin DIMM of FIG. 10, in accordance with a further embodiment of the invention. In addition to the layout and approximate distance (millimeters) from the key of each pin, FIG. 15 also provides a functional description of each of the pins, including those used as redundant pins and those used for special control functions. Those pins that are used as redundant pins are designated in FIG. 15 using the suffix "_r". As indicated previously, designated pins 1–138 run from left to right on the front side of the DIMM, with pins 139–276 located behind pins 1–138 when viewing the front side of the DIMM.

In an exemplary embodiment, each of the redundant pins is located behind the respective primary function pin for which it is redundant. For example, redundant service pins serv_ifc(1)_r and serv_ifc(2)_r (pins 142, 143) are located directly behind service pins serv_ifc(1) and serv_ifc(2) (pins 4, 5), respectively. In this manner, the DIMM is resistant to single point-of-fail memory outage (e.g., such as if the DIMM were warped or tilted toward one side or the other).

Among the various functions included within the 276-pin layout are a pair of continuity pins (1, 138) and scope trigger pins (3, 141). As will be appreciated from an inspection of the pin assignment table in FIG. 15, as opposed to arranging the pins in a conventional layout (where each group of similarly functioning pins are located in the same section of the DIMM), the present embodiment uses an innovative placement wherein the center region is used for two of the four high-speed busses (s3_us, Output: DIMM to upstream DIMM or to Memory Controller) and (ds_s3, DIMM to upstream DIMM (input)). The other two high-speed busses are each split in half, wherein half of each bus (us_s3, controller or DIMM to DIMM (input) and s3_ds, DIMM to downstream DIMM (output)), with approximately half the signals for each bus placed on either end of the center region pin locations. With the buffer device placed close to the center of the module, the variability in wiring length for each pin in both the center and outer regions may be reduced.

As will also be noted from FIG. 15, the pin layout provides for power at both a first voltage level (e.g., 1.8 volts) and a second voltage level (e.g., 1.2 volts, as shown at pins 75, 213, 79, 217). In this manner, the logic portion of the system may be operated independent of and/or prior to powering up the main memory portion of the system, thereby providing additional system memory usage flexibility and/or power savings.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A dual inline memory module (DIMM), comprising:
   a card having a length of about 151.2 to about 151.5 millimeters;
   a plurality of individual local memory devices attached to said card;
   a buffer device attached to said card, said buffer device configured for converting a packetized memory interface and said buffer device including logic for reading data from the local memory devices and for writing data to the local memory devices; and
   said card including at least 276 pins configured thereon.

2. The DIMM of claim 1, further comprising a positioning key formed on said card, wherein said positioning key is located at a non-center position with respect to a length of the card.

3. The DIMM of claim 1, wherein said at least 276 pins are arranged in a first row of pins and a second row of pins behind said first row.

4. The DIMM of claim 3, further comprising a plurality of redundant pins among said at least 276 pins, wherein a given redundant pin with respect to a given primary function pin is located directly behind said primary function pin.

5. The DIMM of claim 1, wherein said at least 276 pins further comprise a pair of continuity pins, one of said pair of continuity pins located at one end of said card, and the other of said pair of continuity pins located at the opposite end of said card.

6. A dual inline memory module (DIMM), comprising:
   a card having a length of about 151.35 millimeters;
   a plurality of individual local memory devices attached to the card;
   a buffer device attached to the card, said buffer device configured to re-drive information to one or more external memory modules in a cascading manner and said buffer device including logic for reading data from the local memory devices and for writing data to the local memory devices; and
   at least one positioning key formed on the card.

7. The DIMM of claim 6, further comprising a plurality of at least 276 pins formed on said card.

8. The DIMM of claim 7, wherein at least one positioning key is located at a non-center position with respect to a length of the card.

9. The DIMM of claim 7, wherein said at least 276 pins are arranged in a first row of pins and a second row of pins behind said first row.

10. The DIMM of claim 9, further comprising a plurality of redundant pins among said at least 276 pins, wherein a given redundant pin with respect to a given primary function pin is located directly behind said primary function pin.

11. The DIMM of claim 7, wherein said at least 276 pins further comprise a pair of continuity pins, one of said pair of continuity pins located at one end of said card, and the other of said pair of continuity pins located at the opposite end of said card.

* * * * *